US012805000B2

(12) United States Patent
Kawahara et al.

(10) Patent No.: US 12,805,000 B2
(45) Date of Patent: Nov. 17, 2026

(54) SILICON CARBIDE SEMICONDUCTOR DEVICE AND POWER CONVERTER USING SILICON CARBIDE SEMICONDUCTOR DEVICE

(71) Applicant: Mitsubishi Electric Corporation, Tokyo (JP)

(72) Inventors: Kotaro Kawahara, Tokyo (JP); Yuichi Nagahisa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 373 days.

(21) Appl. No.: 18/566,092

(22) PCT Filed: Jul. 7, 2021

(86) PCT No.: PCT/JP2021/025657
§ 371 (c)(1),
(2) Date: Dec. 1, 2023

(87) PCT Pub. No.: WO2023/281669
PCT Pub. Date: Dec. 1, 2023

(65) Prior Publication Data
US 2024/0250165 A1 Jul. 25, 2024

(51) Int. Cl.
*H10D 84/00* (2025.01)
*H02P 27/08* (2006.01)
(Continued)

(52) U.S. Cl.
CPC ......... *H10D 84/146* (2025.01); *H10D 12/031* (2025.01); *H10D 62/127* (2025.01);
(Continued)

(58) Field of Classification Search
CPC .. H10D 84/146; H10D 62/153; H10D 62/127; H10D 62/8325; H10D 12/031; H10P 30/22; H02P 27/08
See application file for complete search history.

(56) References Cited

U.S. PATENT DOCUMENTS

| | | | | |
|---|---|---|---|---|
| 11,488,962 B2 * | 11/2022 | Choi | H10B 12/03 | |
| 2015/0129947 A1 * | 5/2015 | Nagashima | H10B 41/35 | 257/314 |

(Continued)

FOREIGN PATENT DOCUMENTS

| | | |
|---|---|---|
| WO | 2016/052261 A1 | 4/2016 |
| WO | 2019/124378 A1 | 6/2019 |

OTHER PUBLICATIONS

International Search Report and Written Opinion mailed on Oct. 12, 2021, received for PCT Application PCT/JP2021/025657, filed on Jul. 7, 2021, 08 pages including English Translation.

(Continued)

*Primary Examiner* — Ali Naraghi
*Assistant Examiner* — Kimberly Newman Frey
(74) *Attorney, Agent, or Firm* — XSENSUS LLP

(57) ABSTRACT

A silicon carbide semiconductor device according to the present disclosure includes: a drift layer of a first conductivity type on a semiconductor substrate of the first conductivity type; a well region of a second conductivity type in a surface layer of the drift layer; a source region of the first conductivity type; a first separation regions of the first conductivity type that is a stripe, formed in a constant width, and formed in the well region in a plan view, the first separation region including a bent tip; a second separation region of the first conductivity type that is formed adjacent (Continued)

to the well region; a gate insulating film; a gate electrode; a Schottky electrode on the first separation region; and a source electrode.

18 Claims, 12 Drawing Sheets

(51) Int. Cl.
*H10D 12/01* (2025.01)
*H10D 62/10* (2025.01)
*H10D 62/13* (2025.01)
*H10D 62/832* (2025.01)
*H10P 30/22* (2026.01)

(52) U.S. Cl.
CPC ....... *H10D 62/153* (2025.01); *H10D 62/8325* (2025.01); *H10P 30/22* (2026.01); *H02P 27/08* (2013.01)

(56) References Cited

U.S. PATENT DOCUMENTS

| | | | | |
|---|---|---|---|---|
| 2017/0236935 | A1 | 8/2017 | Ebihara et al. | |
| 2019/0181259 | A1 * | 6/2019 | Hino | H10D 12/031 |
| 2019/0371936 | A1 | 12/2019 | Nagahisa et al. | |
| 2020/0295177 | A1 | 9/2020 | Hino et al. | |
| 2021/0098483 | A1 * | 4/2021 | Kang | H10B 43/10 |
| 2021/0151634 | A1 * | 5/2021 | Denda | A61B 5/0002 |
| 2023/0036221 | A1 * | 2/2023 | Hino | H02M 1/08 |
| 2023/0139229 | A1 * | 5/2023 | Kawahara | H10D 30/669<br>257/77 |

OTHER PUBLICATIONS

German Office Action issued Oct. 15, 2025, in corresponding German Patent Application No. 112021007935.2, 1 21pp.
German Office Action issued Oct. 15, 2025, in corresponding German Patent Application No. 112021007935.2, 21pp.

* cited by examiner

SILICON CARBIDE SEMICONDUCTOR DEVICE AND POWER CONVERTER USING SILICON CARBIDE SEMICONDUCTOR DEVICE

CROSS-REFERENCE TO RELATED APPLICATION

This application is based on PCT filing PCT/JP2021/025657, filed Jul. 7, 2021, the entire contents of which are incorporated herein by reference.

TECHNICAL FIELD

The present disclosure relates to a silicon carbide semiconductor device made of silicon carbide, and a power converter including the silicon carbide semiconductor device.

BACKGROUND ART

It is known that continuously passing a forward current, that is, a bipolar current through p-n diodes made of silicon carbide (SiC) creates a problem in the reliability, that is, stacking faults in crystals which cause a forward voltage to shift. This probably occurs due to expansion of the stacking faults that are plane defects caused by recombination energy obtained when minority carriers implanted through the p-n diodes are recombined with majority carriers. The expansion originates from, for example, a basal plane dislocation in silicon carbide substrates. The stacking faults obstruct the current flow. Hence, the expansion of the stacking faults reduces the current and increases the forward voltage, thus causing reduction in the reliability of semiconductor devices.

The forward voltage also increases in vertical metal oxide semiconductor field effect transistors (MOSFETs) made of silicon carbide. The vertical MOSFETs each include a parasitic p-n diode (body diode) between a source and a drain. When the forward current flows through this body diode, the vertical MOSFETs also suffer from the reduction in the reliability, similarly to the p-n diodes. When a body diode of a SiC-MOSFET is used as a free-wheeling diode of a MOSFET, the MOSFET characteristics may deteriorate.

A method for solving the problem in the reliability which is caused by the passage of the forward current through the parasitic p-n diodes is to incorporate and use, in an active region of a semiconductor device that is a unipolar transistor such as a MOSFET, Schottky barrier diodes (SBD) that are unipolar diodes as freewheeling diodes. Since the density of SBDs formed around an edge of the active region is lower than that of SBDs inside the active region, body diodes have predominantly operated.

A technology for disposing SBDs in a terminal region around the active region at a density higher than that in the active region has been disclosed to reduce the predominant operations of the body diodes around the edge of the active region (for example, Patent Document 1).

PRIOR ART DOCUMENT

Patent Document

[Patent Document 1] WO2019/124378

SUMMARY

Problem to be Solved by the Invention

Even with application of the technology of the aforementioned prior art document, the density of the SBDs around the edge of the active region is still sometimes lower than that of the SBDs inside the active region. Widening the SBDs in a cross-sectional view to increase the density of the SBDs around the edge of the active region sometimes increases an electric field to be applied to a Schottky interface and increases a leakage current in a reverse blocking state.

The present disclosure has been conceived to solve the problems, and has an object of providing a silicon carbide semiconductor device in which a density of SBDs around an edge of an active region can be increased without increasing a leakage current in a reverse blocking state so that a unipolar current of a higher density can flow through the silicon carbide semiconductor device.

Means to Solve the Problem

A silicon carbide semiconductor device and a power converter according to the present disclosure each include: a semiconductor substrate made of silicon carbide of a first conductivity type; a drift layer formed on the semiconductor substrate, the drift layer being of the first conductivity type; a well region formed in a surface layer of the drift layer, the well region being of a second conductivity type; a source region formed in a surface layer of the well region and formed inside the well region in a plan view, the source region being of the first conductivity type; a first separation region of the first conductivity type that is a stripe, formed in a constant width, and formed in the well region in the plan view, the first separation region including a tip formed in a bent shape; a Schottky electrode formed on and Schottky connected to the first separation region; a source electrode ohmic connected to the well region and the source region, the source electrode being formed on the Schottky electrode; a second separation region formed adjacent to the well region, the second separation region being of the first conductivity type; and a gate electrode formed on the well region through a gate insulating film, the well region being formed between the source region and the second separation region in the plan view.

Effects of the Invention

A silicon carbide semiconductor device with high reliability can be produced from the silicon carbide semiconductor device according to the present disclosure.

DESCRIPTION OF EMBODIMENTS

Figure 1:
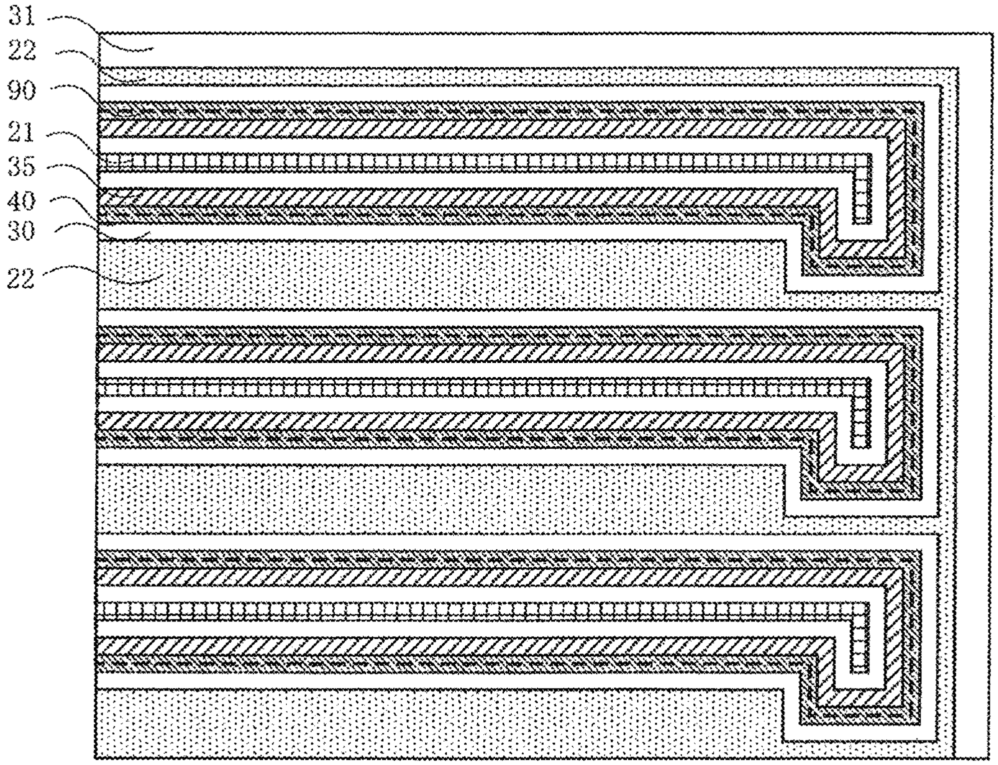
FIG. 1 is a plan view of a silicon carbide semiconductor device according to Embodiment 1.

Embodiment are described hereinafter with reference to the accompanying drawings. Since the drawings are schematically illustrated, the mutual relationships in size and position between images in the different drawings are not necessarily accurate but may be appropriately changed. Furthermore, the same reference numerals are assigned to the same constituent elements in the illustration, and their names and functions are the same. Thus, a detailed description thereof may be omitted in some cases.

Although the first conductivity type is n-type and the second conductivity type is p-type in the following description, the conductivity types may be reversed.

Embodiment 1

First, a silicon carbide semiconductor device according to Embodiment 1 of the present disclosure will be described.

Figure 2:
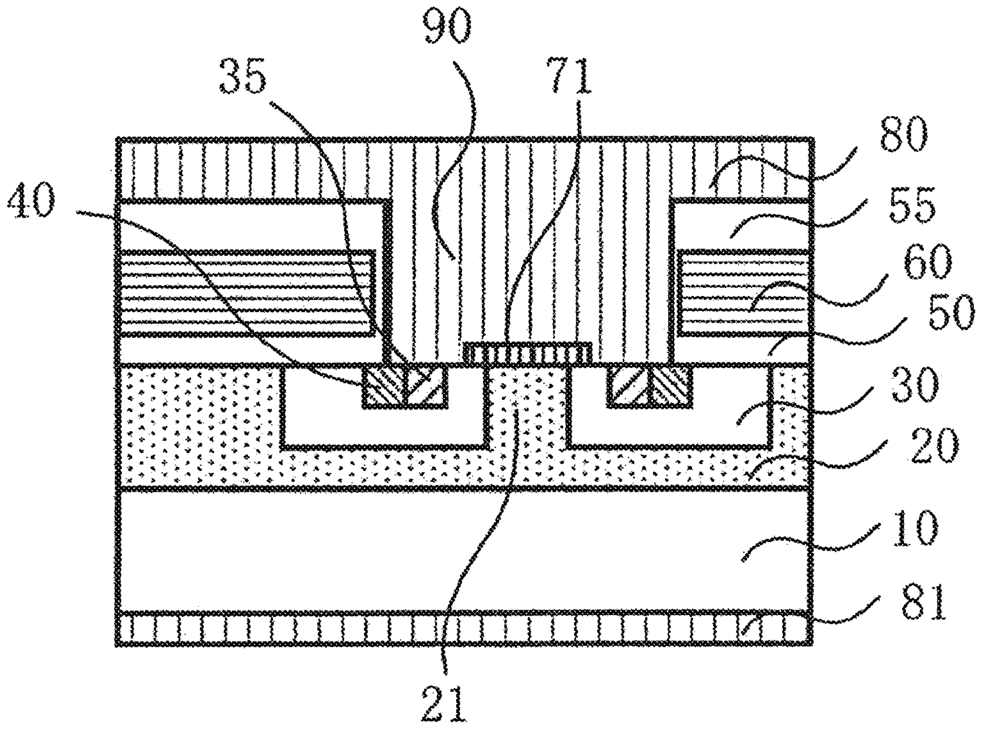
FIG. 2 is a cross-sectional view of the silicon carbide semiconductor device according to Embodiment 1.

FIG. 1 is a plan view near the surface of a silicon carbide layer at an edge of an active region of a silicon carbide MOSFET with built-in Schottky barrier diodes (a SiC-MOSFET with built-in SBDs) that is the silicon carbide semiconductor device according to Embodiment 1. Furthermore, FIG. 2 is a cross-sectional view of a plane crossing an SBD region at the edge of the active region of the SiC-MOSFET with the built-in SBDs according to Embodiment 1.

As illustrated in FIG. 1, striped n-type first separation regions 21 corresponding to striped SBDs are periodically formed in the active region of the SiC-MOSFET with the built-in SBDs according to Embodiment 1. A terminal region is formed around the active region, and a p-type terminal well region 31 is formed to surround the active region.

Each of the striped first separation regions 21 is bent at a right angle with respect to a direction extending from the center of the active region to be formed at the edge of the active region, that is, in the active region near a boundary between the active region and the terminal region. Here, the striped first separation regions 21 are formed in the same width, that is, in a constant width at the center and the surrounding area of the active region.

A p-type well region 30 is periodically formed around each of the first separation regions 21 to surround the first separation region 21 in a plan view. In other words, each of the n-type first separation regions 21 is formed inside the well region 30 in the plan view. A p-type contact region 35 of low resistance is formed at a predetermined distance from the first separation regions 21, inside each of the well regions 30 in the plan view. Furthermore, an n-type source region 40 of low resistance is formed opposite to the n-type first separation region 21 with respect to the contact region 35. The well region 30 is formed outside the source region 40.

An n-type second separation region 22 is formed adjacent to the well regions 30, outside the well regions 30 in each of which the contact region 35 and the source region 40 are formed, that is, opposite to the side on which the first separation regions 21 are formed in a plan view. The second separation region 22 is a part of a drift layer 20.

Furthermore, the adjacent well regions 30 are formed spaced apart. The second separation region 22 is formed between the well regions 30 and the terminal well region 31 in the terminal region.

Next, a cross-sectional structure in a direction crossing one of the first separation regions 21 in FIG. 1, that is, in a direction orthogonal to the extension direction of the striped first separation regions 21 will be descried with reference to FIG. 2.

As illustrated in FIG. 2, the drift layer 20 made of n-type silicon carbide is formed on the surface of a semiconductor substrate 10 made of n-type silicon carbide of low resistance, in the SiC-MOSFET with the built-in SBDs according to Embodiment 1. A pair of the well regions 30 that are spaced apart in the cross-sectional view and made of p-type silicon carbide is formed in a surface layer of the drift layer 20. The n-type first separation region 21 that is a part of the drift layer 20 is formed between the paired well regions 30.

The n-type second separation region 22 that is a part of the drift layer 20 is formed opposite to the well regions 30 across the first separation regions 21, that is, outside the well regions 30. The source region 40 made of n-type silicon carbide is formed in a surface layer in a location at a predetermined distance from an end of the well region 30 on the second separation region 22 side, in the direction from the second separation region 22 toward the first separation region 21. The p-type contact region 35 of low resistance which is higher in p-type impurity concentration than the well regions 30 and made of p-type silicon carbide is formed inner than the source region 40, that is, inside a surface layer of the well region 30 which is closer to the first separation region 21 with respect to the source region 40. Here, a region made of silicon carbide, that is, a region formed initially as the drift layer 20 will be referred to as the silicon carbide layer, irrespective of whether ions are implanted into the region.

Here, the source region 40 and the contact region 35 are formed in contact with each other.

A source electrode 80 ohmic connected to the well regions 30 and the source region 40 is formed on the surface of the source region 40 and the contact region 35. A Schottky electrode 71 is formed from the surface of the first separation region 21 to the surface of the well region 30 adjacent to the first separation region 21, and is Schottky connected to the first separation region 21. The first separation region 21 and the Schottky electrode 71 form an SBD. The interface between the first separation region 21 and the Schottky electrode 71 becomes a Schottky interface.

A gate insulating film 50 made of silicon oxide is formed on the surface of the source region 40 within the well region 30, on the second separation region 22, and on the well region 30 between the source region 40 and the second separation region 22 in a plan view. A gate electrode 60 made of polycrystal silicon of low resistance is formed on the well region 30 through the gate insulating film 50. The well region 30 is formed between the source region 40 and the second separation region 22 in the plan view. The surface layer of the well region 30 facing the gate electrode 60 through the gate insulating film 50 functions as a channel region, at a lower portion of the gate electrode 60.

An interlayer insulating film 55 made of silicon oxide is formed on the gate electrode 60 and the gate insulating film 50. A contact hole 90 from which the gate insulating film 50 and the interlayer insulating film 55 have been removed is formed on the source region 40, the contact region 35, and the Schottky electrode 71. The source electrode 80 is formed in the contact hole 90 and on the interlayer insulating film 55. Broken lines in FIG. 1 indicate positions of the contact holes 90 in a plan view.

An ohmic electrode (not illustrated) made of metal silicide that ohmic-connects the contact region 35 to the source electrode 80 is formed between the source electrode 80 and the contact region 35.

A drain electrode 81 is formed on a surface of the semiconductor substrate 10 opposite to the drift layer 20. An ohmic electrode (not illustrated) made of metal silicide that ohmic connects the semiconductor substrate 10 to the drain electrode 81 is formed between the semiconductor substrate 10 and the drain electrode 81.

The Schottky electrode 71 and the source electrode 80 may be made of the same material.

Hereinafter, a method of manufacturing the SiC-MOSFET with the built-in SBDs as the silicon carbide semiconductor device according to Embodiment 1 of the present disclosure will be described.

First, the drift layer 20 made of n-type silicon carbide having an impurity concentration ranging from $1\times10^{15}$ $cm^{-3}$ to $1\times10^{17}$ $cm^{-3}$ and having a thickness ranging from 5 μm to 100 μm is epitaxially grown by chemical vapor deposition (CVD) on the first principal surface of the semiconductor substrate 10 having 4H polytype and made of n-type silicon carbide of low resistance. A plane direction of the first principal surface of the semiconductor substrate 10 is a (0001) plane having an off angle (for example, 4°). The drift layer 20 may be 100 μm thick or more, depending on the breakdown voltage of a silicon carbide semiconductor device.

Subsequently, an implantation mask is formed using a photoresist, for example, in a predetermined region on the surface of the drift layer 20, and aluminum (Al) as p-type impurities is ion-implanted. Here, the depth of the ion-implanted Al approximately ranges from 0.5 μm to 3 μm, which does not exceed the thickness of the drift layer 20. The impurity concentration of the ion-implanted Al ranges from $1\times10^{17}$ $cm^{-3}$ to $1\times10^{19}$ $cm^{-3}$, which is higher than that of the drift layer 20. Then, the implantation mask is removed. With this process, the ion-implanted Al region becomes the well regions 30.

Next, an implantation mask is formed using, for example, a photoresist so that a predetermined portion inside each of the well regions 30 in the surface of the drift layer 20 is opened. Then, nitrogen (N) as n-type impurities is ion-implanted. The depth of the ion-implanted N is shallower than the well regions 30. The impurity concentration of the ion-implanted N ranges from $1\times10^{18}$ $cm^{-3}$ to $1\times10^{21}$ $cm^{-3}$, which exceeds the p-type impurity concentration of the well regions 30. N-type regions in the region N-implanted through this process become the source regions 40. Then, the implantation mask is removed.

Likewise, ion-implanting Al into predetermined regions inside the well regions 30 with an impurity concentration higher than that of the well regions 30 forms the contact regions 35. An impurity concentration of Al for the contact regions 35 should range from $1\times10^{18}$ $cm^{-3}$ to $1\times10^{21}$ $cm^{-3}$.

Next, a thermal processing device performs annealing in an inert gas atmosphere such as argon (Ar) at a temperature from 1300 to 1900° ° C. for 30 seconds to 1 hour. This annealing electrically activates the ion-implanted N and Al.

Next, the surface of the silicon carbide layer consisting of the drift layer 20, the well region 30, the source region 40, and the contact region 35 is thermally oxidized to form a silicon oxide film as the gate insulating film 50 with a thickness ranging from 10 nm to 300 nm. Then, a polycrystalline silicon film having conductivity is formed by low pressure CVD on the gate insulating film 50, and is patterned to form the gate electrode 60. Subsequently, the interlayer insulation film 55 made of silicon oxide is formed by low pressure CVD.

Next, a contact hole (a first portion of a contact hole) penetrating the interlayer insulating film 55 and the gate insulating film 50 and reaching the contact region 35 and the source region 40 is formed by dry etching.

Then, a metal film made of nickel (Ni) as a main component is formed by, for example, sputtering. Then, a thermal treatment is performed at a temperature ranging from 600° C. to 1100° C., and the metal film made of Ni as the main component reacts with the silicon carbide layer in the contact hole (first portion) to form silicide between the silicon carbide layer and the metal film. When the metal film is made of Ni, the silicide is nickel silicide. Next, the residual metal film other than the silicide resulting from the reaction is removed by wet etching. The silicide formed herein becomes the ohmic electrode that is not illustrated.

Then, a resist mask is formed on the surface of the ohmic electrode and the interlayer insulating film 55 by photolithography.

Next, the gate insulating film 50 and the interlayer insulating film 55 above the surface of the first separation region 21 are wet etched using an etching solution containing hydrofluoric acid, with the resist mask being formed. A region wet etched herein becomes a part of a contact hole (a second portion of the contact hole). Then, the resist mask is removed.

Next, the Schottky electrode 71 made of, for example, Ti or Mo is formed on the surface of the first separation region 21 to be Schottky connected to the first separation region 21. Furthermore, the source electrode 80 made of Al as a main component is formed on the Schottky electrode 71 and the ohmic electrode.

Subsequently, forming the drain electrode 81 at the bottom to come in contact with the backside ohmic electrode on the backside can manufacture the SiC-MOSFET with the built-in SBDs as the silicon carbide semiconductor device according to Embodiment 1 whose cross-sectional view is illustrated in FIG. 2.

The angle at which each of the first separation regions 21 is bent need not be 90° but may be an angle closer to 90°. Furthermore, the first separation regions 21 bent at an angle larger than approximately 60° can increase the density of SBDs around the edge of the active region more than those without any bent portions.

Although the first separation regions 21 formed in the same width in a plan view are described, the first separation regions 21 need not be formed strictly in the same width. The first separation regions 21 may have differences of approximately ±1 μm in width as long as the electric field to be applied to the Schottky interface is not increased.

Here, in a freewheeling operation of the silicon carbide semiconductor device according to Embodiment 1, a freewheeling current flows through the SBDs in principle. However, the freewheeling current does not flow through the p-n body diode between the well region 30 and the drift layer 20. Unless SBDs are formed with the edges being bent as according to Embodiment 1, the surface density of the SBDs near a boundary between the active region and the terminal region is lower than that in the center of the active region. Thus, there have been some tendencies to apply voltages to body diodes and turn the body diodes ON. Furthermore, widening the SBDs sometimes increases the leakage current in a reverse blocking state.

However, since the first separation regions 21 are bent to be formed at the edge of the active region of the silicon carbide semiconductor device according to Embodiment 1, the surface density of the SBDs near the boundary between the active region and the terminal region can be as high as that in the center of the active region. This can prevent the tendencies to turn the body diodes ON at the edge of the active region.

Since the striped first separation regions 21 have a constant width and are bent in the active region in the SiC-MOSFET with the built-in SBDs as the silicon carbide semiconductor device according to Embodiment 1, the density of the SBDs around the edge of the active region can be increased without increasing the leakage current in a reverse blocking state in the active region, and a unipolar current of a higher density can flow through the silicon carbide semiconductor device.

Figure 3:
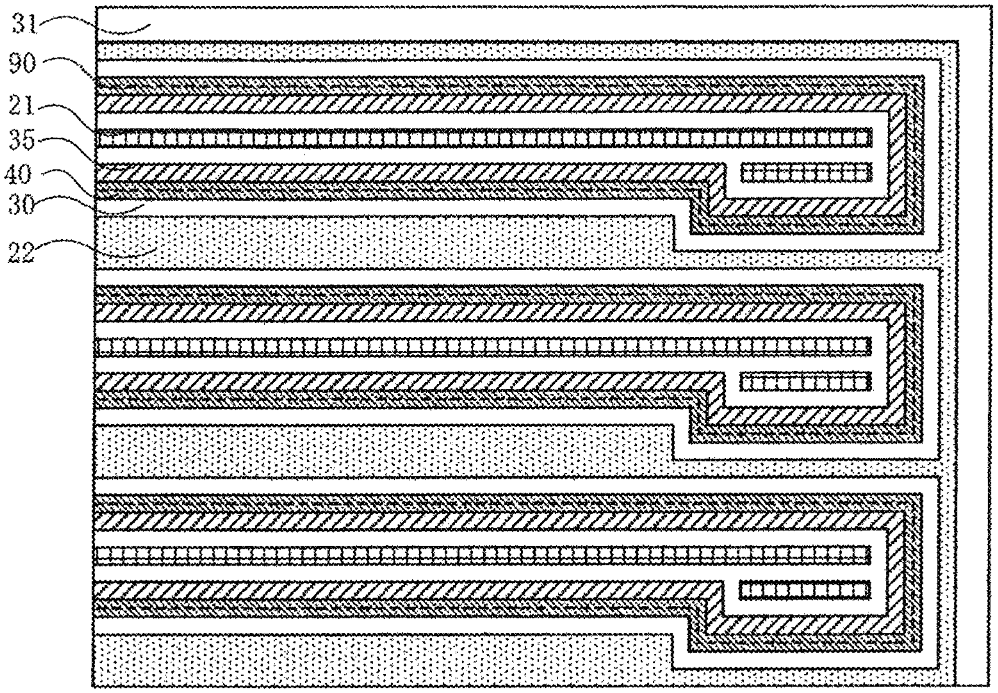
FIG. 3 is a reference plan view of the silicon carbide semiconductor device according to Embodiment 1.
Figure 4:
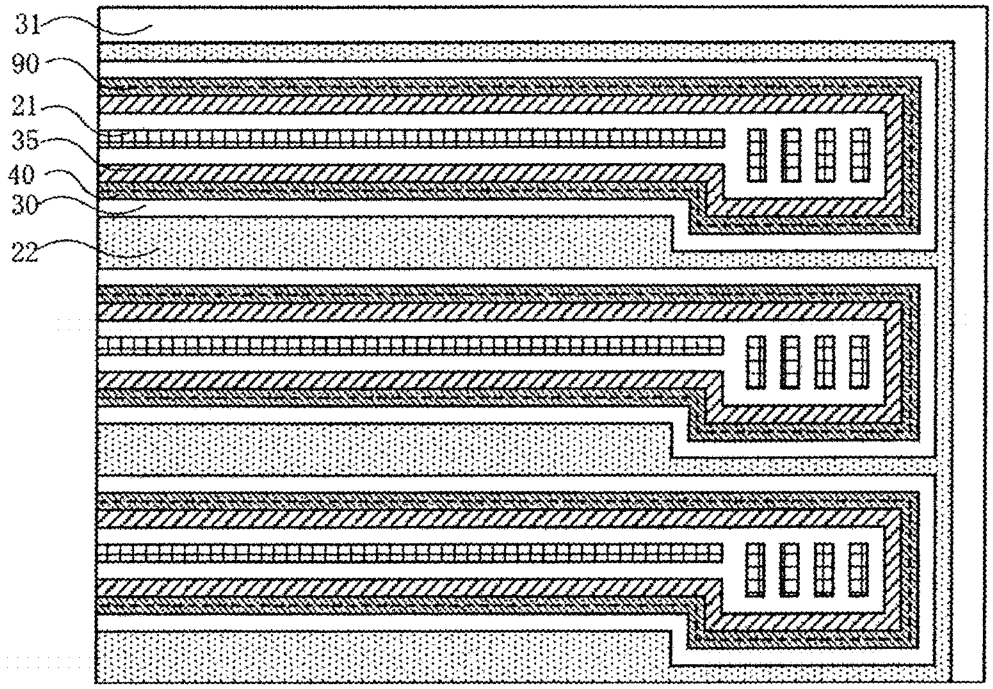
FIG. 4 is a reference plan view of the silicon carbide semiconductor device according to Embodiment 1.

It is conceivable to adopt a method of forming isolated SBDs separate from the SBDs in the active region to increase the density of the SBDs around the edge of the active region. When the well regions 30 around the SBD regions are formed through ion implantation, protecting regions to be SBDs using a resist forms SBD regions of smaller widths in a cross-sectional view. Here, the SBD regions are isolated and formed in a narrow width as illustrated in reference plan views of FIGS. 3 and 4. Specifically, if the first separation regions 21 are formed separately in each of the well regions 30, a linear resist of a small width collapses during the ion implantation and sometimes causes pattern defects.

However, the first separation regions 21 corresponding to the SBD regions are bent and continuously formed each in an area enclosed by one of the well regions 30 in the silicon carbide semiconductor device according to Embodiment 1. Thus, the resist of the small width hardly collapses during the ion implantation, and pattern defects can be reduced more than that when the isolated SBD regions or the linear SBD regions are formed.

Embodiment 2

Figure 5:
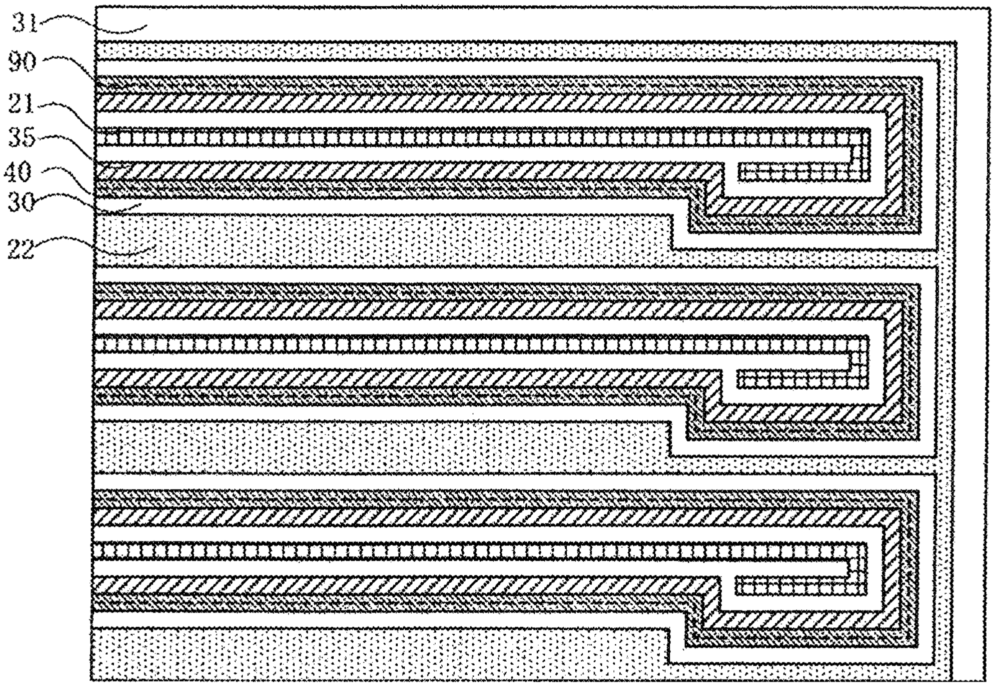
FIG. 5 is a plan view of a silicon carbide semiconductor device according to Embodiment 2.

FIG. 5 is a plan view near the surface of a silicon carbide layer at an edge of an active region in a silicon carbide semiconductor device according to Embodiment 2. The silicon carbide semiconductor device according to Embodiment 2 differs from that according to Embodiment 1 in that the striped first separation regions 21 are bent twice at the edge of the active region. The portion bent twice is obtained by bending the portion extending from the center of the active region at an angle of 180°, and is formed parallel to the portion extending from the center of the active region. The other points are similar to those of Embodiment 1. Thus, the detailed description is omitted.

As illustrated in FIG. 5, the SBDs, that is, the first separation regions 21 in the SiC-MOSFET with the built-in SBDs as the silicon carbide semiconductor device according to Embodiment 2 are bent at the angle of 180° at the edge of the active region. The well regions 30 are formed between the bent first separation regions 21. The end of the bent first separation region 21 is not connected to its own first separation region 21.

Figure 6:
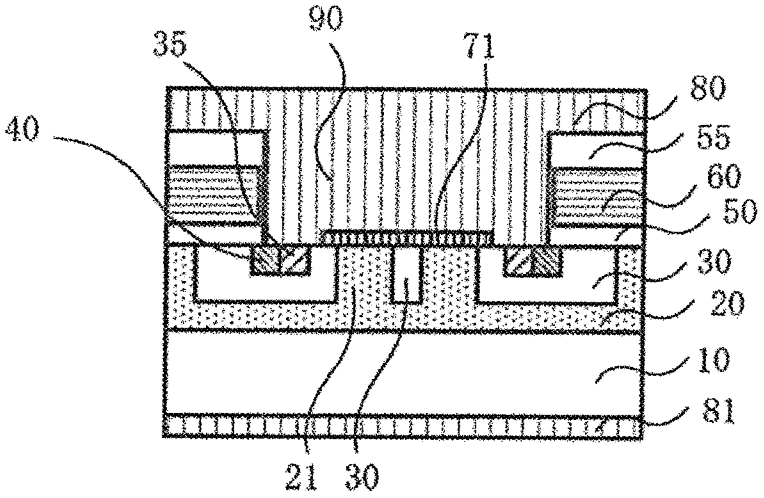
FIG. 6 is a cross-sectional view of the silicon carbide semiconductor device according to Embodiment 2.

FIG. 6 illustrates a schematic cross-sectional view of a plane crossing the two striped first separation regions 21 in one of the well regions 30, in a region where the first separation region 21 is bent. As illustrated in the schematic cross-sectional view of FIG. 6, the two striped first separation regions 21 are formed in the well region 30. A p-type well region 30 is formed in a region sandwiched by the first separation regions 21 between the two first separation regions 21.

In FIG. 6, the Schottky electrode 71 is formed on the well region 30 outside the first separation regions 21 and the well region 30 sandwiched by the first separation regions 21 between the two first separation regions 21. As indicated by the broken lines in FIG. 5, the contact holes 90 are each formed to open a portion above the first separation regions 21, the well region 30 sandwiched by the first separation regions 21, the well region 30 between the first separation region 21 and the contact region 35, the contact region 35, and the source region 40. The source electrode 80 is formed within the contact hole 90 and on the interlayer insulating film 55. The ohmic electrode that is not illustrated is formed on the contact region 35.

The well regions 30 may be Schottky connected to the Schottky electrode 71.

Furthermore, the SiC-MOSFET with the built-in SBDs according to Embodiment 2 can be manufactured in a method identical to that of manufacturing the SiC-MOSFET according to Embodiment 1 by manufacturing a region obtained by combining the first separation regions 21 and the well region 30 between the first separation regions 21 as the second portion of the contact hole.

The first separation regions 21 in the SiC-MOSFET with the built-in SBDs as the silicon carbide semiconductor device according to Embodiment 2 are bent at the angle of 180° to be formed at the edge of the active region. Thus, in the regions where the first separation regions 21 are bent, the electric field to be applied to the Schottky interface is smaller than that when the first separation regions 21 are widened, and an increase in the leakage current in a reverse blocking state is prevented. The SBDs two or more times larger in area than those in the center of the active region per length along the extension direction of the first separation regions 21 can also be formed in the regions.

When the well region 30 around the SBD region is formed through ion implantation, a narrow resist mask for ion implantation is bent at the angle of 180° and formed. Thus, the resist mask hardly collapses at the edge, and pattern defects can be reduced more.

As illustrated in FIG. 5, the end of the portion bent at the angle of 180° of the first separation region 21 is not connected to its own first separation region 21. However, the end of the bent portion of the first separation region 21 may be connected to the linear first separation region 21 as illustrated in the plan view of FIG. 7. Here, the well region 30 is formed in a region enclosed by the first separation region 21 in a plan view.

Figure 7:
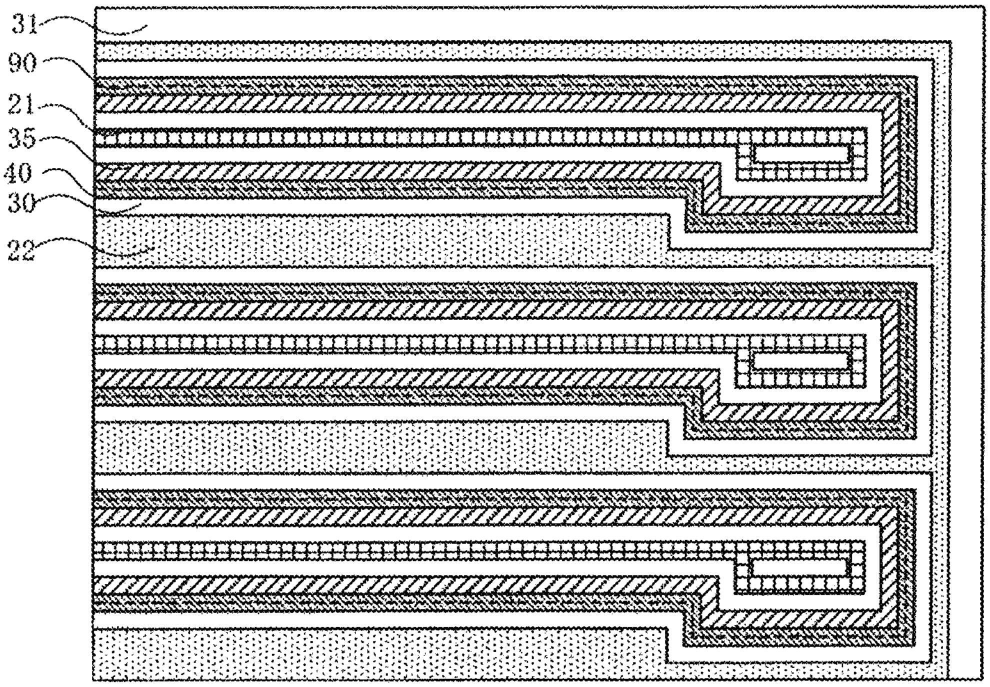
FIG. 7 is a plan view of a modification of the silicon carbide semiconductor device according to Embodiment 2.

In the structure illustrated in FIG. 7, an increase in the leakage current in a reverse blocking state can be prevented, and the SBDs two or more times larger in area than those in the center of the active region can be formed at the edge of the active region.

Although the leakage current in the structure illustrated in FIG. 7 is increased slightly more than that of the structure in FIG. 5 in a reverse blocking state, the structure illustrated in FIG. 7 less triggers the resist collapse in manufacturing. Furthermore, the SBDs two or more times larger in area than those in the center of the active region can be formed at the edge of the active region.

Figure 8:
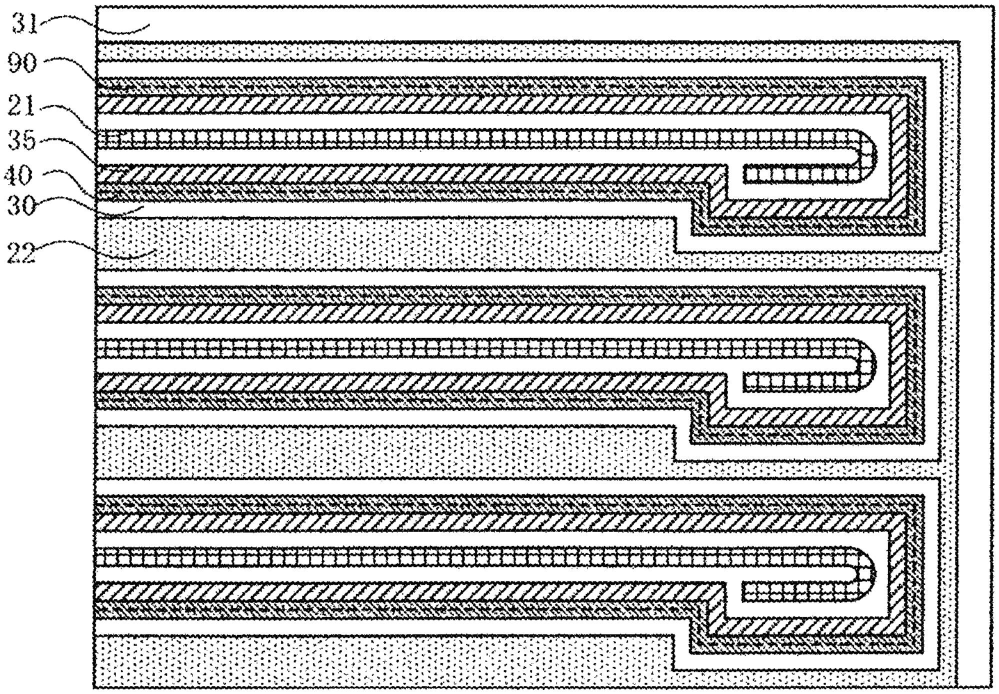
FIG. 8 is a plan view of a modification of the silicon carbide semiconductor device according to Embodiment 2.

Furthermore, the bent first separation regions 21 may be curvilinearly bent as illustrated in the plan view of FIG. 8. In the structure of FIG. 8, the first separation regions 21 are bent in a U-shape, and the outer peripheries of the first separation regions 21 are curvilinearly formed. This structure can also prevent an increase in the leakage current in a reverse blocking state, and form the SBDs two or more times larger in area than those in the center of the active region, at the edge of the active region. As a whole, the density of the unipolar current flowing through the edge of the active region can be as high as that flowing through the active center of the active region.

Embodiment 3

Figure 9:
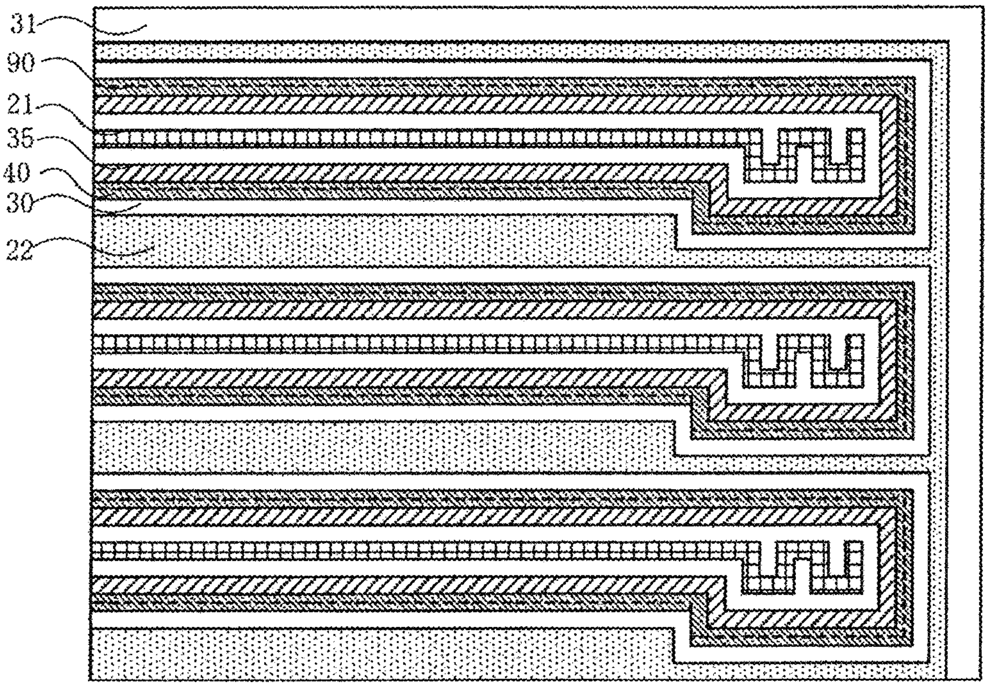
FIG. 9 is a plan view of a silicon carbide semiconductor device according to Embodiment 3.

FIG. 9 is a plan view near the surface of a silicon carbide layer at an edge of an active region in a silicon carbide semiconductor device according to Embodiment 3. The silicon carbide semiconductor device according to Embodiment 3 differs from that according to Embodiment 1 in that the striped first separation regions 21 are bent three times or more at the edge of the active region. The other points are similar to those of Embodiment 1. Thus, the detailed description is omitted.

As illustrated in the plan view of FIG. 9, the first separation regions 21, that is, the SBDs in the SiC-MOSFET with the built-in SBDs as the silicon carbide semiconductor device according to Embodiment 3 are formed at the edge of the active region in a zigzag pattern, that is, in a shape obtained by bending a straight line alternately to the right and left. The number of times the first separation regions 21 are bent should be three or more.

Thus, in the region where the first separation regions 21 are bent in the silicon carbide semiconductor device according to Embodiment 3, the electric field to be applied to the Schottky interface decreases more than that when the first separation regions 21 are widened, and an increase in the leakage current in a reverse blocking state is prevented. The SBDs two or more times larger in area than those in the center of the active region per length along the extension direction of the first separation regions 21 can be formed. When the well regions 30 around the SBD regions are formed through ion implantation, narrow resist masks for ion implantation are bent in a zigzag pattern and formed. Thus, the resist masks hardly collapse at the edge, and pattern defects can be reduced more.

Embodiment 4

Figure 10:
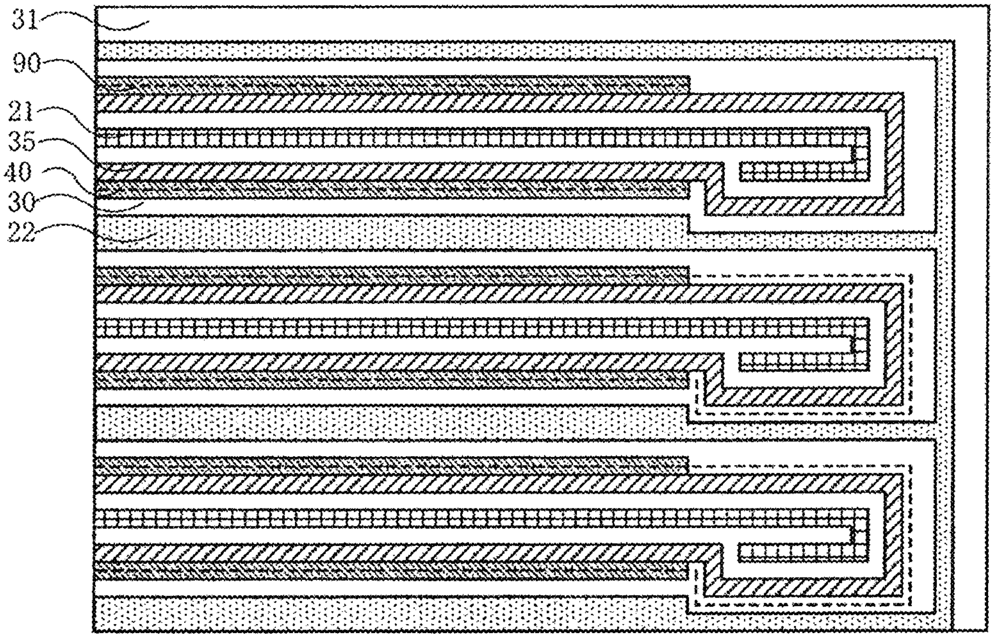
FIG. 10 is a plan view of a silicon carbide semiconductor device according to Embodiment 4.

FIG. 10 is a plan view near the surface of a silicon carbide layer at an edge of an active region in a silicon carbide semiconductor device according to Embodiment 4. The silicon carbide semiconductor device according to Embodiment 4 differs from that according to Embodiment 1 in that each of the source regions 40 in the well region 30 is not formed in a region in which the first separation region 21 is bent at the edge of the active region. The other points are similar to those of Embodiment 2. Thus, the detailed description is omitted.

FIG. 10 is a plan view near the surface of a silicon carbide layer including SBDs in the SiC-MOSFET with the built-in SBDs as a silicon carbide semiconductor device according to Embodiment 4. In the SiC-MOSFET with the built-in SBDs according to Embodiment 4, the source regions 40 arranged in stripes are formed to sandwich the first separation regions 21 in the well regions 30 in the center of the active region, whereas the source regions 40 are not formed in the regions in which the first separation regions 21 are bent at the edge of the active region as illustrated in FIG. 10.

Here, the contact region 35 enclosing the first separation region 21 in the well region 30 similarly to the source region 40 according to Embodiment 2 is formed to enclose the entirety of the first separation region 21 similarly to Embodiment 2.

Since the source regions 40 are not formed in the regions in which the first separation regions 21 are bent in the SiC-MOSFET with the built-in SBDs as the silicon carbide semiconductor device according to Embodiment 4, the well regions 30 in the bent portions in a direction orthogonal to the extension direction of the first separation regions 21 can be thinner. Although a current decrease is seen due to no formation of a MOSFET in the bent portion from which the source region 40 is removed, one of the well regions 30 can be thinned. Thus, a larger number of the well regions 30 per unit area can be disposed, and the well regions 30 can be disposed at a high density as a whole. Consequently, an ON resistance can be reduced more.

In addition to the advantages obtained from the silicon carbide semiconductor device according to Embodiment 2, the silicon carbide semiconductor device according to Embodiment 4 can reduce the ON resistance more.

Since the width (a length in the direction orthogonal to the extension direction of the first separation region 21) of the second separation region 22 in the center of the active region can be reduced more than that of the silicon carbide semiconductor device according to Embodiment 2, the electric field to be applied to the gate insulating film 50 formed on the second separation region 22 can be reduced more. This can enhance the reliability of the silicon carbide semiconductor device. Since the density of the first separation regions 21, that is, the SBDs per area of the entirety of the active region can be increased more than that of the silicon carbide semiconductor device according to Embodiment 2, a unipolar current of a higher density can flow through the silicon carbide semiconductor device.

Although Embodiment 4 describes the structure in which the contact regions 35 enclose the first separation regions 21, the contact regions 35 need not always enclose the first separation regions 21 but may be removed in the bent portions similarly to the source regions 40.

Embodiment 5

Figure 11:
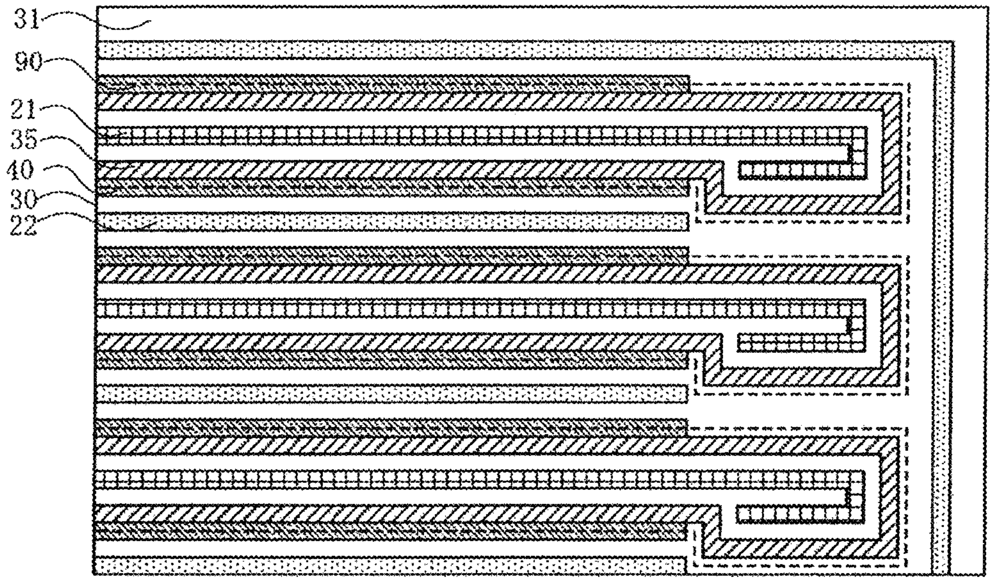
FIG. 11 is a plan view of a silicon carbide semiconductor device according to Embodiment 5.

FIG. 11 is a plan view near the surface of a silicon carbide layer at an edge of an active region in a silicon carbide semiconductor device according to Embodiment 5. The silicon carbide semiconductor device according to Embodiment 5 differs from that according to Embodiment 4 in that the adjacent well regions 30 are connected to each other in the regions in which the first separation regions 21 are bent. The other points are similar to those of Embodiment 4. Thus, the detailed description is omitted.

FIG. 11 is a plan view near the surface of a silicon carbide layer including SBDs in the SiC-MOSFET with the built-in SBDs as a silicon carbide semiconductor device according to Embodiment 5. As illustrated in FIG. 11, the well regions 30 enclosing the first separation regions 21, that is, the well regions 30 including the first separation regions 21 are connected to each other in the SiC-MOSFET with the built-in SBDs according to Embodiment 5. Although the n-type second separation regions 22 are formed between the adjacent well regions 30 in the bent portions of the first separation regions 21 in Embodiments 1 to 4, the second separation regions 22 are not formed in the bent portions in Embodiment 5.

Here, the contact region 35 is formed to enclose the entirety of each of the first separation regions 21 similarly to Embodiment 4.

In the bent portions of the first separation regions 21 in the SiC-MOSFET with the built-in SBDs as the silicon carbide semiconductor device according to Embodiment 5, the source regions 40 are not formed, and the adjacent well regions 30 are connected to each other. Thus, the bent portion of the well region 30 enclosing one of the first separation regions 21 can be thinner in the direction orthogonal to the extension direction of the first separation region 21. Thus, a larger number of the well regions 30 each enclosing one of the first separation regions 21 can be disposed per unit area. Consequently, the ON resistance can be reduced more.

Since the width (the length in the direction orthogonal to the extension direction of the first separation region 21) of the second separation region 22 in the center of the active region can be reduced more than that of the silicon carbide semiconductor device according to Embodiment 4, the electric field to be applied to the gate insulating film 50 formed on the second separation region 22 can be reduced more. This can enhance the reliability of the silicon carbide semiconductor device. Since the density of the first separation regions 21, that is, the SBDs per area of the entirety of the active region can be increased more than that of the silicon carbide semiconductor device according to Embodiment 4, a unipolar current of a higher density can flow through the silicon carbide semiconductor device.

The silicon carbide semiconductor device according to Embodiment 5 can reduce the ON resistance more and enhance the reliability more, in addition to the advantages obtained from the silicon carbide semiconductor device according to Embodiment 4. Although aluminum (Al) is used as p-type impurities in Embodiment 5, the p-type impurities may be boron (B) or gallium (Ga). The n-type impurities may be phosphorus (P) instead of nitrogen (N). In the MOSFETs described in Embodiments 1 to 5, the gate insulating film needs not always be an oxide film such as $SiO_2$, but may be an insulating film other than the oxide film or a combination of an insulating film other than the oxide film and an oxide film. Embodiments above describe, for example, a crystal structure, a plane direction of a principal surface, an off angle, and each implantation condition using the specific examples. However, the applicability is not limited to the given numerical ranges.

Although Embodiment 5 describes the SBDs built in a vertical MOSFET as a silicon carbide semiconductor device in which the drain electrode 81 is formed on the backside of the semiconductor substrate 10, Embodiment 5 is also applicable to a MOSFET with built-in SBDs which has a super junction structure.

Embodiment 6

Embodiment 6 will describe a power converter to which the silicon carbide semiconductor devices according to Embodiments 1 to 5 are applied. Although the present disclosure is not limited to specific power converters, Embodiment 6 will describe application of the present disclosure to a three-phase inverter.

Figure 12:
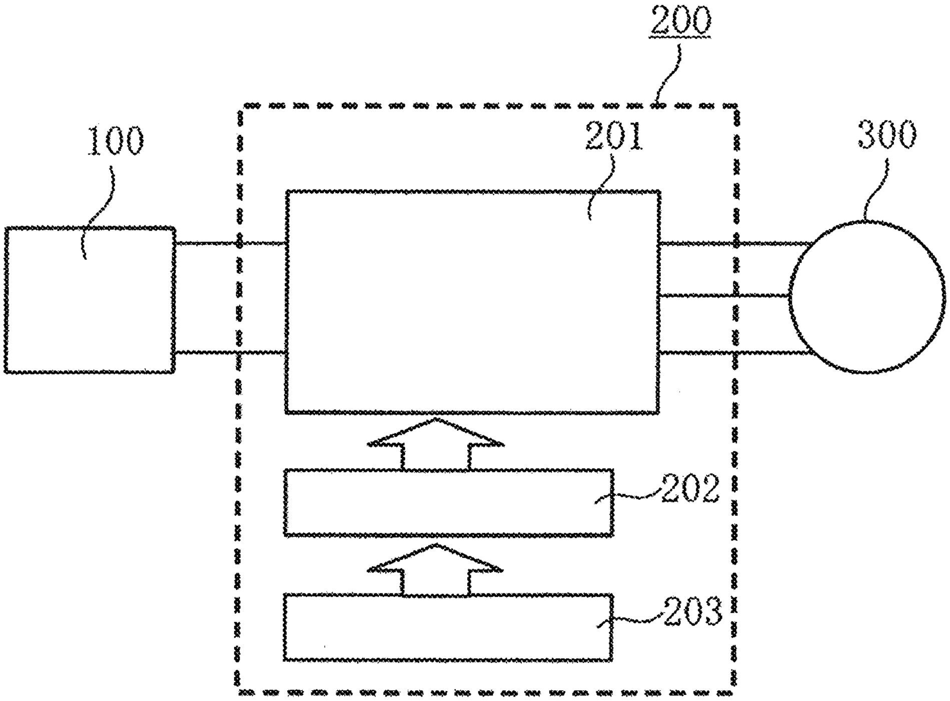
FIG. 12 is a schematic diagram illustrating a configuration of a power converter according to Embodiment 6.

FIG. 12 is a block diagram illustrating a configuration of a power conversion system to which the power converter according to Embodiment 6 is applied.

The power conversion system illustrated in FIG. 12 includes a power source 100, a power converter 200, and a load 300. The power source 100, which is a DC power source, supplies a DC power to the power converter 200. The power source 100 may include various types of components such as a direct current system, a solar battery, or a rechargeable battery, and may include a rectifying circuit connected to an AC system or an AC/DC converter. The power source 100 may include a DC/DC converter which converts the DC power output from a DC system into a predetermined power.

The power converter 200 is a three-phase inverter connected between the power source 100 and the load 300, and converts the DC power supplied from the power source 100 into the AC power to supply the AC power to the load 300. As illustrated in FIG. 12, the power converter 200 includes a main conversion circuit 201 which converts the DC power into the AC power, a driving circuit 202 that outputs a drive signal for driving each switching element in the main conversion circuit 201, and a control circuit 203 which outputs, to the driving circuit 202, a control signal for controlling the driving circuit 202.

The driving circuit 202 performs OFF control on each normally-off type switching element so that a voltage of the gate electrode is equal to a voltage of the source electrode.

The load 300 is a three-phase electrical motor driven by the AC power supplied from the power converter 200. The load 300 is not for a specific purpose of usage, but is an electrical motor mounted on various types of electrical devices, and is used as an electrical motor for a hybrid automobile, an electrical automobile, a railroad vehicle, an elevator, or an air-conditioning apparatus, for example.

The power converter 200 will be described in detail hereinafter. The main conversion circuit 201 includes switching elements and free-wheeling diodes (not illustrated). Switching of the switching element causes the DC power supplied from the power source 100 to be converted into the AC power. The AC power is then supplied to the load 300. The specific circuit configuration of the main conversion circuit 201 is of various types. The main conversion circuit 201 according to Embodiment 6 is a three-phase full-bridge circuit having two levels, and includes six switching elements and six free-wheeling diodes anti-parallel connected to the respective switching elements. The silicon carbide semiconductor device according to any one of Embodiments 1 to 5 described above is applied to each of the switching elements of the main conversion circuit 201. The six switching elements form three pairs of upper and lower arms in each pair of which the two switching elements are serially connected to each other. The three pairs of upper and lower arms form the respective phases (U-phase, V-phase, and W-phase) of a full-bridge circuit. Output terminals of each pair of the upper and lower arms, that is, three output terminals of the main conversion circuit 201 are connected to the load 300.

The driving circuit 202 generates the drive signal for driving the switching element of the main conversion circuit 201, and supplies the drive signal to a control electrode of the switching element of the main conversion circuit 201. Specifically, the driving circuit 202 outputs the drive signal for making the switching element enter an ON state and the drive signal for making the switching element enter an OFF state to a control electrode of each of the switching elements in accordance with a control signal from the control circuit 203 to be described hereinafter. When the switching element is kept in the ON state, the drive signal is a voltage signal (ON signal) higher than or equal to a threshold voltage of the switching element. When the switching element is kept in the OFF state, the drive signal is a voltage signal (OFF signal) lower than or equal to the threshold voltage of the switching element.

The control circuit 203 controls the switching element of the main conversion circuit 201 so that desired electrical power is supplied to the load 300. Specifically, the control circuit 203 calculates a time (ON time) at which each of the switching elements of the main conversion circuit 201 should enter the ON state based on the electrical power to be supplied to the load 300. For example, the control circuit 203 can control the main conversion circuit 201 by PWM control modulating the ON time of the switching element in accordance with the voltage to be output. Then, the control circuit 203 outputs a control instruction (control signal) to the driving circuit 202 so that the driving circuit 202 outputs the ON signal to the switching element which needs to enter the ON state and outputs the OFF signal to the switching element which needs to enter the OFF state at each time. The driving circuit 202 outputs the ON signal or the OFF signal as the drive signal to the control electrode of each of the switching elements, in accordance with this control signal.

Since the silicon carbide semiconductor devices according to Embodiments 1 to 5 are applied to the power converter according to Embodiment 6 as the switching elements of the main conversion circuit 201, a low-loss power converter that performs more reliable high-speed switching can be achieved.

Although Embodiment 6 describes the example of applying the present disclosure to the three-phase inverter having the two levels, the present disclosure is not limited to this but is applicable to various power converters. Although Embodiment 6 describes the power converter having the two levels, the power converter may have three or multiple levels. The present disclosure may be applied to a single-phase inverter when the power is supplied to a single-phase load. When the electrical power is supplied to a DC load, for example, the present disclosure is applicable to a DC/DC converter or an AC/DC converter.

The load for the power converter to which the present disclosure is applied is not limited to an electrical motor. The power converter is also applicable as a power-supply device of an electrical discharge machine, a laser beam machine, an induction heat cooking device, or a non-contact power feeding system, and is further applicable as a power conditioner of, for example, a solar power system or an electricity storage system.

EXPLANATION OF REFERENCE SIGNS

10 semiconductor substrate, 20 drift layer, 21 first separation region, 22 second separation region, 30 well region, 31 terminal well region, 35 contact region, 40 source region, 50 gate insulating film, 55 interlayer insulating film, 60 gate electrode, 71 Schottky electrode, 80 source electrode, 81 drain electrode, 90 contact hole, 100 power source, 200 power converter, 201 main conversion circuit, 202 driving circuit, 203 control circuit, 300 load.

The invention claimed is:

1. A silicon carbide semiconductor device, comprising:

a semiconductor substrate made of silicon carbide of a first conductivity type;

a drift layer formed on the semiconductor substrate, the drift layer being of the first conductivity type;

a well region formed in a surface layer of the drift layer, the well region being of a second conductivity type;

a source region formed in a surface layer of the well region and formed inside the well region in a plan view, the source region being of the first conductivity type;

a first separation region of the first conductivity type that is a stripe, formed in a constant width, and formed in the well region in the plan view, the first separation region including a tip formed in a bent shape in the plan view;

a Schottky electrode formed on and Schottky connected to the first separation region;

a source electrode ohmic connected to the well region and the source region, the source electrode being formed on the Schottky electrode;

a second separation region formed adjacent to the well region, the second separation region being of the first conductivity type; and a gate electrode formed on the well region through a gate insulating film, the well region being formed between the source region and the second separation region in the plan view.

2. The silicon carbide semiconductor device according to claim 1, wherein the tip of the first separation region is bent at an angle of 180°.

3. The silicon carbide semiconductor device according to claim 1, wherein the first separation region is not connected to its own first separation region.

4. The silicon carbide semiconductor device according to claim 1, wherein an outer periphery of a bent portion of the tip of the first separation region is a curve.

5. The silicon carbide semiconductor device according to claim 1, wherein the first separation region is bent three times or more in the plan view.

6. The silicon carbide semiconductor device according to claim 1, wherein the source region is not formed around the tip.

7. The silicon carbide semiconductor device according to claim 1, comprising a plurality of well regions including the well region, wherein the plurality of well regions are formed spaced apart in the surface layer of the drift layer.

8. The silicon carbide semiconductor device according to claim 1, comprising a plurality of well regions including the well region, wherein the plurality of well regions each including the first separation region in the plan view are connected to each other to be formed in the surface layer of the drift layer.

9. The silicon carbide semiconductor device according to claim 1, wherein a region sandwiched by the first separation region in the well region is a part of the well region.

10. The silicon carbide semiconductor device according to claim 9, wherein the source electrode is formed on the part of the well region that is the region sandwiched by the first separation region in the well region.

11. The silicon carbide semiconductor device according to claim 1, further comprising a contact region enclosing the first separation region in the well region and being higher in impurity concentration of the second conductivity type than the well region, the contact region being of the second conductivity type.

12. A power converter, comprising:

a main conversion circuit including the silicon carbide semiconductor device according to claim 1, the main conversion circuit converting an input power to output a resulting power;

a driving circuit performing an OFF operation so that a voltage of the gate electrode is equal to a voltage of the source electrode, and outputting, to the silicon carbide semiconductor device, a drive signal for driving the silicon carbide semiconductor device, the gate electrode and the source electrode being included in the silicon carbide semiconductor device; and a control circuit outputting, to the driving circuit, a control signal for controlling the driving circuit.

13. The silicon carbide semiconductor device according to claim 2, wherein the first separation region includes a first stripe portion extending in a first direction and a second stripe portion extending parallel to the first stripe portion, the second stripe portion being connected to the first stripe portion at the tip bent at the angle of 180°, such that the first separation region is formed in a U-shape in the plan view.

14. The silicon carbide semiconductor device according to claim 1, wherein the first separation region is continuously and integrally formed within the well region and is enclosed within the well region in the plan view.

15. The silicon carbide semiconductor device according to claim 1, wherein the first separation region has the constant width along an entire length thereof including at the tip, the constant width being a same width at a straight portion and at the bent tip of the first separation region.

16. The silicon carbide semiconductor device according to claim 6, wherein the source region is formed on both sides of a straight portion of the first separation region in the plan view, and the source region is absent in a region of the well region around the tip of the first separation region.

17. The silicon carbide semiconductor device according to claim 1, wherein the first conductivity type is n-type and the second conductivity type is p-type, wherein the semiconductor substrate is made of n-type silicon carbide, and wherein the first separation region comprises n-type silicon carbide having a same impurity concentration as the drift layer.

18. The silicon carbide semiconductor device according to claim 11, wherein the contact region encloses an entirety of the first separation region in the plan view, and wherein the source electrode is ohmic connected to the well region through the contact region.

* * * * *